United States Patent [19]

Benhamida

[11] Patent Number: 5,230,014
[45] Date of Patent: Jul. 20, 1993

[54] SELF-COUNTING SHIFT REGISTER

[75] Inventor: Boubekeur Benhamida, Ada County, Id.

[73] Assignee: Honeywell Inc., Minneapolis, Minn.

[21] Appl. No.: 716,483

[22] Filed: Jun. 17, 1991

[51] Int. Cl.$^5$ ............................................. G11C 19/00
[52] U.S. Cl. ....................................... 377/75; 377/70; 377/115; 377/78; 307/272.2
[58] Field of Search ................... 377/70, 73, 75, 76, 377/115, 78; 307/279, 272.2

[56] References Cited
U.S. PATENT DOCUMENTS

| | | | |
|---|---|---|---|
| 4,630,295 | 12/1986 | Kamuro et al. | 377/73 |
| 4,703,200 | 10/1987 | Zangara | 307/279 |
| 4,759,042 | 7/1988 | Humpleman | 377/75 |
| 5,132,993 | 7/1992 | Nishiura et al. | 377/76 |

Primary Examiner—John S. Heyman
Attorney, Agent, or Firm—Gregory A. Bruns

[57] ABSTRACT

A shift count confirmation shift register capable of receiving and storing logic values and sequentially providing representations thereof at the storage register output, as well as providing a shift complete signal at a confirmation signal output upon the completion of the shifting of these logic states stored therein.

12 Claims, 2 Drawing Sheets

SELF-COUNTING SHIFT REGISTER

BACKGROUND OF THE INVENTION

The present invention relates to shift registers and, more particularly, to shift registers which accept parallel data and provide that same data in serial form at an output thereof.

Shift registers are well known and extensively used in many kinds of logic systems. Shift registers, formed as a cascade of a selected number of single logic value storage elements or storage registers, perform a number of different kinds of functions in such logic systems.

Thus, shift registers can be connected to serve as counters, logic wave form generators and many other kinds of logic subsystems where temporary storage of logic states are needed. One particularly useful function for shift registers is the performance of serial-to-parallel conversions and the opposite kinds of conversions, parallel-to-serial conversions, of multiple logic values.

In a parallel-to-serial converter, a plurality of logic values are concurrently provided to and stored in corresponding ones of the series-connected cascade of storage registers in the shift register. Subsequently, the contents of the storage registers are shifted along the series thereof so that each stored logic value sequentially appears at the output of the last storage register.

In these circumstances, a counter is needed to be provided which counts these shifts of the logic values, originally introduced in parallel into the storage registers, down the storage register cascade. When the number counted on such a counter has reached a value equal to the number of logic values which were originally introduced in parallel, an indication is available that the shifting has been completed in the shift register. Then, another set of logic values can be concurrently provided thereto for storage therein to again be converted to a serial stream.

This requirement of an accompanying counter increases the area of a monolithic integrated circuit chip devoted to the serial-to-parallel conversion process beyond that just required for the shift register to be provided therein. In addition, the size of the counter must increase as the length of the sift register increases. Thus, there is a desire to provide a shift register arrangement in which the need for an accompanying counter can be avoided.

SUMMARY OF THE INVENTION

The present invention provides a shift count confirmation shift register capable of receiving and storing logic values and sequentially providing representations thereof at the storage register output, as well as providing a shift complete signal at a confirmation signal output upon the completion of the shifting of these logic states stored therein. A plurality of storage registers connected from the output of one to the input of another, except at the first and final ones of said registers, forms the shift register. This shift register receives logic values in parallel from logic signals for storage in the storage registers thereof, other than in the initial one of these registers which instead has a first logic value provided thereto for storage therein by a state insertion means concurrently with these logic values. Thereafter, these stored logic states are shifted out from one register to the next to reach the shift register output. The state insertion means provides sequentially a pattern of logic values to the input of the initial storage register which are also shifted along these remaining registers following after the shifting of the previously stored logic values. A state pattern detection means provides a shift complete signal when the first state reaches the final storage register and the sequential pattern of logic states is in the remaining storage registers of the shift register.

BRIEF DESCRIPTION OF THE DRAWINGS

FIG. 1, including

DETAILED DESCRIPTION OF THE PREFERRED EMBODIMENTS

FIG. 1 shows a mixed logic and circuit schematic diagram of a shift register arrangement embodying the present invention. Those electrical connections between the logic elements shown in this figure and both a positive voltage supply terminal, 10, and a ground voltage reference terminal, 11, for the purpose of supplying electrical power thereto are omitted. The shift register arrangement of FIG. 1 has a number of cascaded storage registers provided therein, each of the storage registers having a master flip-flop connected at its output to a slave flip-flop to form that register. Each of these flip-flops is a D-type flip-flop, but other types could alternatively be used.

Figure 1A:
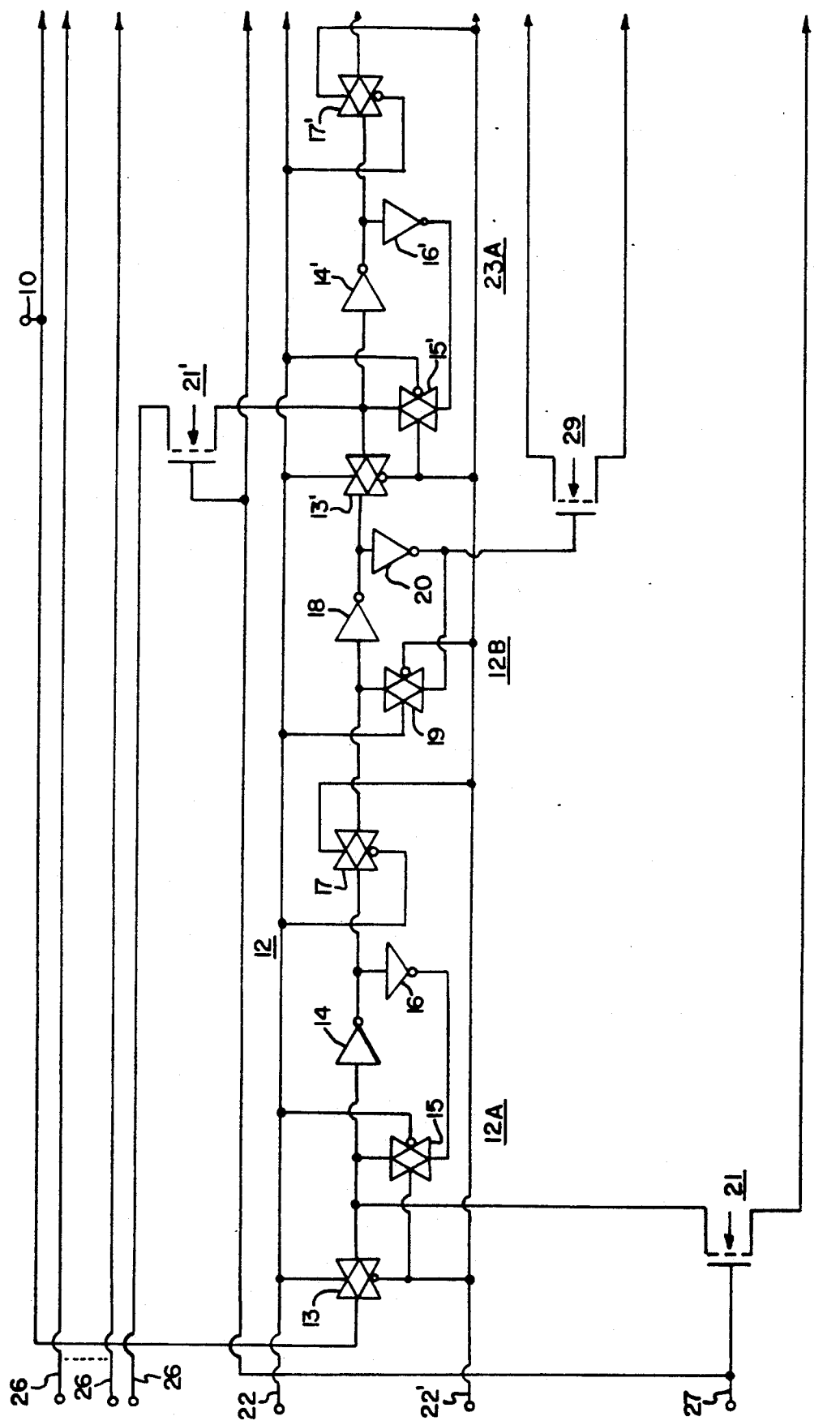
FIG. 1A and 1B, is a logic and circuit schematic diagram of a shift register embodying the present invention.

In FIG. 1A, there is shown an initial storage register, 12, in the cascade thereof having a master flip-flop, 12A, and a slave flip-flop, 12B. Master flip-flop 12A has an input complementary metal- oxide-semiconductor (CMOS) field-effect transistor (FET) transmission gate, 13, with its transmission path input connected to terminal 10 and its transmission path output connected to the input of a direct CMOS inverter, 14, and to the transmission path output of a feedback CMOS transmission gate, 15. The output of direct inverter 14 is connected to the input of a CMOS feedback inverter, 16, which has its output connected to the transmission path input of transmission gate 15.

Similarly, slave flip-flop 12B has an input CMOS transmission gate, 17, with its transmission path input connected to the output of direct inverter 14. The transmission path output of transmission gate 17 is connected to the input of another direct CMOS inverter, 18, and the transmission path output of a feedback CMOS transmission gate, 19. The output of inverter 18 is connected to the input of a feedback CMOS inverter, 20, which has its output in turn connected to the transmission path input of transmission gate 19.

The control terminals of the transmission gates in both master flip-flop 12A and slave flip-flop 12B are connected to one or the other of a pair of clock signal interconnections, 22' and 22. The clock signals to be applied to interconnections 22' and 22 are each a repeated pulse voltage waveform where the voltage is supplied alternately at the high logic level voltage and the low logic level voltage in each period for equal time durations therein. The signal on clock interconnection 22' is the logical complement of that appearing on clock interconnection 22.

In storage register 12, the direct control terminal of input transmission gate 13 is connected to clock interconnection 22, and the complementary control terminal in that gate, designated by a small circle, is connected to clock interconnection 22'. Thus, if the voltage on clock interconnection 22 is in the high voltage level logic state and that on clock interconnection 22' is in the low voltage level logic state, input transmission gate 13 will be in the "on" condition to pass signals therethrough from its transmission path input to its transmission path output. If the voltages on clock interconnections 22' and 22 are reversed, input transmission gate 13 will be in the "off" condition preventing any significant current from being transmitted therethrough. The control terminals of feedback transmission gate 19 in slave flip-flop 12B are connected in the same way so that these two flip-flops are each always in the same one of the "on" and "off" transmission conditions.

The control terminals in feedback transmission gate 15 in master flip-flop 12A and in input transmission gate 17 in slave flip-flop 12B are connected just oppositely. The direct control connections of each are connected to clock interconnection 22', and the complementary control connections of each are connected to clock interconnection 22. Thus, transmission gates 15 and 17 will always be together in either being in the "on" condition or the "off" condition, but will always be in the opposite one of these conditions from that taken by transmission gates 13 and 19.

In this arrangement, a high or low voltage logic state applied to the transmission path input of input transmission gate 13 of master flip-flop 12A will be transmitted therethrough if clock interconnection 22 is at a high voltage level logic state, and this input logic state will thus be applied at the input of direct inverter 14. The resulting opposite logic state at the output of direct inverter 14 will be applied to the input of feedback inverter 16. The resulting opposite logic state at its output, matching that at the input of transmission gate 13, will thus be applied to the transmission path input of feedback transmission gate 15, and there be blocked from being transmitted further since gate 15 is in the condition opposite that of gate 13 or the "off" condition. The logic state at the output of inverter 14 will also be blocked by input transmission gate 17 of slave flip-flop 12B from being transmitted into that flip-flop since gate 17 is also in the condition opposite that of gate 13, or the "off" condition.

Upon a reversal of the voltage states on clock interconnections 22' and 22, so that clock interconnection 22' is in the high voltage level logic state and clock interconnection 22 is in the low voltage level logic state, input transmission gate 13 of master flip-flop 12A will go into the "off" condition. This change is accompanied by feedback transmission gate 15 going into the "on" condition. Thus, whatever logic state is present at the transmission path input of gate 13 will no longer have an effect in master flip-flop 12A, but rather the logic value which had previously appeared at the output of feedback inverter 16 is now applied through feedback transmission gate 15 to the input of inverter 14 to result in a stable logic state situation at each of inverters 14 and 16.

The logic state present at the output of direct inverter 14 is also passed through input transmission gate 17 of slave flip-flop 12B, now in the "on" condition, to the input of direct inverter 18 where it directs which logic states appear at the outputs of direct inverter 18 and feedback inverter 20. However, this logic state at the output of direct inverter 14 that is passed through transmission gate 17 to the input of direct inverter 18 to determine the output logic state thereof has no immediate effect on to the next storage register in the cascade. This is because its input transmission gate will be in the same transmission condition as input transmission gate 13 as will be described below. As noted above, gate 13 is in the "off" condition. Thus, the logic state at the output of direct converter 18 will not propagate any further at this time along the storage register cascade in the shift register of FIG. 1. Similarly, the output of feedback inverter 20 is blocked by feedback transmission gate 19.

Upon the next reversal of logic states on clock interconnections 22' and 22, the logic values at the inputs of inverters 18 and 20 in slave flip-flop 12B will be preserved as feedback transmission gate 19 goes into the "on" condition and input transmission gate 17 goes into the "off" condition to create a stable logic feedback situation. Because of direct inverters 14 and 18 being previously directly connected due to transmission gate 17 having been in the "on" condition, the same logic state will appear at the output of inverter 18 as was originally provided at the input of transmission gate 13. Thus, this initial logic state at the input of transmission gate 13 is stored in slave flip-flop 12B and is available to be transmitted, or "shifted" to the next storage register in the cascade connected to the output of direct inverter 18 of slave flip-flop 12B.

An enhancement mode, n-channel field-effect transistor, 21, having its drain connected to the input of inverter 14, is provided as an alternative way of setting the logic states occurring in master flip-flop 12A as shown in FIG. 1A. Thus, when input transmission gate 13 of master flip-flop 12A is in the "off" condition, the switching on of transistor 21 into the "on" condition will set the voltage level which occurs at the input of direct inverter 14. Because of the feedback loop involving direct inverter 14 and feedback inverter 16, and "on" condition feedback transmission gate 15 forming a stable logic feedback situation, this logic state value at the input of inverter 14 will be maintained in master flip-flop 12A in the manner indicated above for a logic state input introduced through transmission gate 13 being maintained through feedback transmission gate 15 being subsequently switched to the "on" condition. Thus, the logic state introduced through transistor 21 can override that which had been previously introduced in this feedback loop through input transmission gate 13. The control of transistor 21 and the voltage state which can be introduced thereby will be described below.

Transmission gates 13, 15, 17 and 19, and inverters 14, 16, 18 and 20, are, as indicated above, all constructed using CMOS field-effect transistor circuits formed in a monolithic integrated circuit silicon chip using an n-well structure arrangement in a p-type conductivity substrate. The field-effect transistors directly shown in FIG. 1 are a part of the same chip and circuit technology. Each enhancement mode, n-channel insulated gate field-effect transistor (IGFET), e.g. a silicon gate MOSFET, is formed as a switching device directly in the p-type substrate. Each enhancement mode, p-channel IGFET, also silicon gate MOSFET, is formed as a switching device in an n-type conductivity region, the well or tub, which is earlier formed in the p-type conductivity substrate. In such an arrangement, each substrate connection for each n-channel MOSFET is made to the p-type conductivity substrate, and this substrate is typically connected to the most negative supply of voltage in the circuit or ground reference terminal 11. Each of the p-channel MOSFET substrate connections is made to the n-type conductivity well or tub in which it is formed, these wells in turn being, typically, each electrically connected to the most positive supply of voltage in the circuit or terminal 10. Such transistor substrate connections are not shown in FIG. 1 to minimize schematic diagram complexity. The CMOS technology involved can be implemented in a number of well known manners.

Figure 1B:
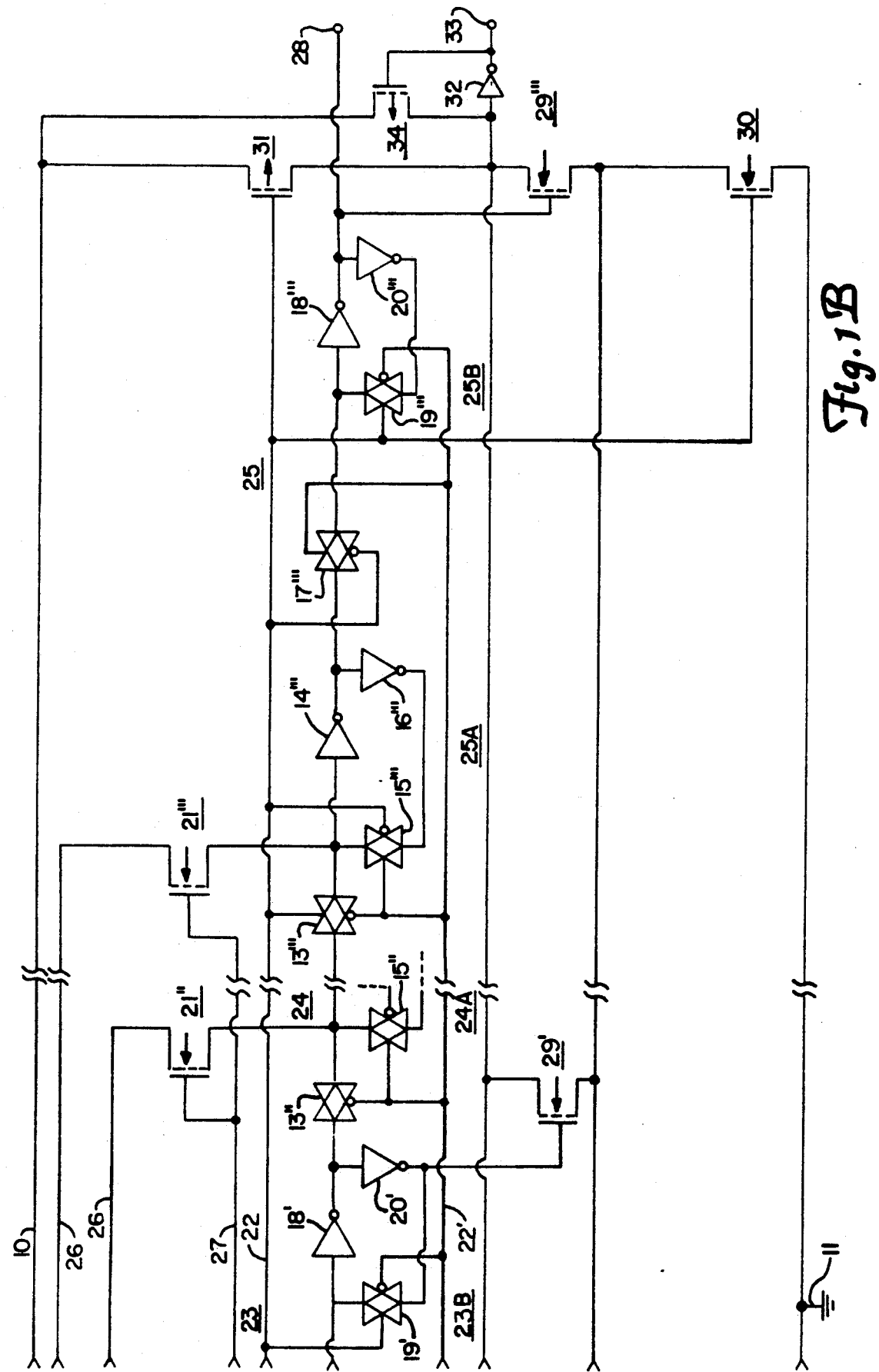

Another storage register, 23, the next in the cascade thereof forming the shift register of FIG. 1, is shown partly in FIG. 1A and partly in FIG. 1B. Shift register 23 has its input connected to an output of storage register 12 taken at the output of direct inverter 18 of slave flip-flip 12B. Again, a master flip-flop, 23A, as part of storage register 23 and shown entirely in FIG. 1A, is connected at its output to the input of a slave flip-flop, 23B, shown partly in each of FIGS. 1A and 1B, to complete forming storage register 23. The logic elements in master flip-flop 23A are the same kinds of logic elements used in master flip-flop 12A, and the logic elements used in slave flip-flop 23B are the same kinds used in slave flip-flop 12B. Because of this, the same designations are used for the logic elements of storage register 23, but with primes being added thereto, as were used for the corresponding logic elements of storage register 12. The enhancement mode, n-channel CMOS field-effect transistor connected to the input of direct inverter 14' of master flip-flop 23A is identical to transistor 21 and so is designated 21' in FIG. 1A.

This same pattern of storage register construction, and logic element and transistor designation, is continued for the successive storage registers in the cascade thereof forming the shift register of FIG. 1. Thus, the beginning of the next storage register, 24, in this cascade, containing a master flip-flop, 24A, is shown in FIG. 1B connected to an output taken from storage register 23 which is the output of direct inverter 18' in slave flip-flop 23B thereof. The remaining portions of storage register 24 are not shown, but breaks are shown in the interconnections extending therefrom which continue onward to further such storage registers. The local connections, confined to being solely within storage register 24 and that are not shown completed in FIG. 1B, are represented with dashes at the ends of the partial showings thereof. Those logic elements of storage register 24 which are shown in FIG. 1B again have the same designations as the corresponding ones of storage register 12 except double primes have been appended thereto. This is also the manner in which the enhancement mode, n-channel field-effect transistor, 21", corresponding to transistor 21 has been designated.

On the other side of the breaks in FIG. 1B in the interconnections which extend to all the storage registers there is shown in that figure the final one of the cascade of storage registers. This final storage register is designated 25 in FIG. 1B, but is actually the nth one of this cascade of storage registers making up the shift register arrangement of FIG. 1. Storage register 25 again has a master flip-flop, 25A, and a slave flip-flop, 25B, shown in FIG. 1B. Again, the logic elements in storage register 25 are just the same kinds as those used in storage register 12, and so the corresponding ones are designated in storage register 25 as they were appended to each. Again, the enhancement mode, n-channel field-effect transistor, 21''', corresponding to transistor 21 follows this designation pattern. The operation of each of storage registers 23, 24 and 25 is the same as the operation of storage register 12.

Each of transistors 21, 21', 21" and those transistors through 21''', which are connected to the output of the master flip-flop input transmission gate of the storage registers to which they correspond, are used as switches for the purpose of selectively introducing a logic value into those corresponding master flip-flops. Transistor 21 is always used to introduce a low voltage level logic value into master flip-flop 12A of storage register 12. The remaining ones of these transistors 21', 21" and the transistors through 21''' are used to switch into the corresponding master flip-flops a parallel set of logic values from a corresponding set of logic signals. The introduction of these parallel logic values into the master flip-flops from the parallel set of logic signals is done concurrently with the insertion of a low voltage level logic value through transistor 21 into master flip-flop 12A.

Thus, parallel data, or such a parallel set of logic values, representing a selected number of data bits, for instance, can be applied to a set of data input terminals, 26, each of which extends to a terminating region of a corresponding one of transistors 21', 21" through 21'''. The other terminating region of each of these transistors is connected to the transmission path output of the corresponding input transmission gate of the master flip-flop to which it is connected. The gates of these transistors are all joined with the gate of transistor 21 and brought out to a control terminal, 27, at which the conductivity states of these n-channel transistor switches are controlled.

As a result of this arrangement, there is shown in FIG. 1 a shift register arrangement having n storage registers for receiving and storing concurrently n-1 logic values from the n-1 logic signals applied to terminals 26. The remaining storage register, initial storage register 12, always receives a low voltage level logic value through transistors 21 which is stored therein concurrently with the storing of the various voltage level logic values presented on terminals 26 that are transmitted to the remaining corresponding storage registers of the shift register arrangement by transistors 21', 21" through 21'''. In other words, while these remaining storage registers will have bits with logic values of "0" or "1" depending on the values of the particular logic signals applied to transistor 21 at any point in time in which storage thereof occurs, there will always be a "0" bit stored in initial storage register 12 when the other bits are stored in the remaining storage registers.

This storage of bits in the storage registers of the shift register arrangement always occurs with a low voltage level logic state being present on clock interconnection 22 so that the input transmission gates of the storage register master flip-flops are in the "off" condition. There is, as a result, no contention in the storage register master flip-flops of the shift register arrangement of FIG. 1 as to whether a logic value from a preceding storage register or a logic value from a terminal 26 is to be stored therein at the time a control signal on terminal 27 directs transmitting corresponding logic values to the master flip-flops in the storage registers of the FIG. 1 shift register arrangement.

Once a parallel presentation of logic values on terminals 26 has been stored in the master flip-flops of the shift registers past initial shift register 12 in the shift register arrangement of FIG. 1, and a low voltage level logic value has been stored in initial shift register 12, the continued oscillating of the clock signal on interconnection 22 and its complement on interconnection 22' causes the stored logic values to be shifted to the right in that figure. That is, the logic value initially stored in each storage register is shifted first to the next storage register to which its output is connected, and then further shifted again until it is presented at an output terminal, 28, of the FIG. 1 shift register arrangement for presentation to the next signal processing block in the logic system. During this shifting operation, the control signal on terminal 27 assures that transistors 21, 21', 21" and the transistors through 21''' remain in the "off" condition.

However, the input to transmission gate 13 in master flip-flop 12A in storage register 12 is connected to terminal 10 so that a high voltage level logic value is always presented to the input of shift register 12. As a result, as the low level logic value, or "0" bit, initially stored in initial storage register 12 is shifted to the right following the bits originally stored in the remaining shift registers that were introduced through terminals 26, a succession of "1" bits are stored in initial shift register 12 and then shifted along the remaining shift registers in the cascade thereof. At the point where all of the data bits introduced at terminals 26, and initially stored in the master flip-flops of the storage registers past initial storage register 12, have been shifted out of the shift register arrangement of FIG. 1 through being sequentially presented at its output terminal 28, there will be a unique set of logic values stored in the FIG. 1 shift register arrangement. There will be a low voltage level logic value, or "0" bit, stored in final storage register 25 of the shift register arrangement, and there will be high voltage level logic levels, or "1" bits, stored in each of the other storage registers in that arrangement. The "0" bit in final storage register 25 will be due to the initial storage thereof in initial storage register 12 through transistor 21 at the time that the parallel bits were introduced from terminals 26 for storage. The "1" bits in the remaining storage registers will be due to those introduced in initial storage register 12 because of the connection of the transmission path input of input transmission gate 13 to positive voltage terminal 10.

The occurrence of the state in the shift register arrangement of FIG. 1 of a low voltage level logic value in final storage register 25, and high voltage level logic values in all of the remaining storage registers, is sensed by a multiple input, clocked NOR logic gate arrangement. A series of enhancement mode, n-channel field-effect transistors are used to sense the states of the storage registers in the shift register arrangement, such that there is one such sensing transistor, or logic gate input transistor, for each one of the storage registers. The first of these n-channel transistors, 29, shown in FIG. 1A has its gate connected to the junction of the output of feedback inverter 20 and the transmission path input of feedback transmission gate 19 in slave flip-flop 12B of initial storage register 12. A similar connection for the gate is used in the next of these n-channel transistors, 29', shown in FIG. 1B connected to the corresponding point in slave flip-flop 23B in storage register 23.

A similar n-channel transistor is provided for all the remaining storage registers, and the gate of each is connected to the same junction of the output of the feedback inverter and the transmission path input of the feedback transmission gate in the corresponding slave flip-flop of each, except in slave flip-flop 25B of the final storage register. There, the gate of the last of these n-channel transistors, 29''', is shown in FIG. 1B connected to the junction of the output of direct inverter 18''' and the input of feedback inverter 20''' in slave flip-flop 25B.

The sources of all of these sensing transistors, 29 and 29' through 29''', are connected to the drain of a further enhancement mode, n-channel field-effect transistor, 30, shown in FIG. 1B. The source of this latter transistor is connected to ground reference terminal 11. The drain of each of the sensing transistors, or logic gate input transistors, is connected to the drain of an enhancement mode, p-channel transistor, 31, having its source connected to positive voltage terminal 10. The gates of transistors 30 and 31 are both connected to clock interconnection 22.

In this connection arrangement, the presence of a zero in any of the storage registers in the shift register arrangement of FIG. 1, except final storage register 25, leads to a corresponding one of the gate input transistors being in the "on" condition. Since the gates of each of the sensing transistors, or logic gate input transistors, are connected to the output of the corresponding slave flip-flop feedback inverter, the presence of a "1" bit stored in that storage register as reflected at the output of the slave flip-flop thereof leads to a "0" bit, or low level logic value, being applied to the gate of that sensing transistor thereby keeping it in the "off" condition. The presence of a "0" bit stored in the slave flip-flop of the storage register, on the other hand, leads to a high voltage level logic state being applied to the gate of that transistor thereby keeping it in the "on" condition.

If even one of the gate input transistors is in the "on" condition, the drain of p-channel transistor 31 will alternate between a low voltage level logic value and a high voltage level logic value in conjunction with the clock signal on clock interconnection 22 also alternating between such logic states, though the clock signal logic values will be the complement of those occurring at the drain of transistor 31. Thus, so long as there is a "0" bit in any of the storage registers other than the final storage register, the drain of transistor 31 will oscillate between high and low logic values. Since the final gate input sensing transistor 29''' is connected to the output of direct inverter 18''' in slave flip-flop 25B, the presence of a "1" bit stored in the slave flip-flop of final storage register 25 would give the same result.

As a result, if the "0" bit or low voltage level logic value initially presented for storage in initial storage register 12 by transistor 21, at the storing of the parallel bits introduced from terminals 26 into the remaining storage registers, has not shifted all the way through the shift register arrangement of FIG. 1, the drain of transistor 31 will oscillate between the high and low voltage level logic values. However, if there are only "1" bits or high voltage level logic values stored in each of the storage registers other than final register 25, and if there is a "0" or low voltage level logic value stored in final storage register 25, all of the sensing or logic gate input transistors 29 and 29' through 29''' will be in the "off" condition. As a result, there will effectively be an open circuit between the drain of p-channel transistor 31 and the drain of n-channel transistor 30, the two clocked transistors in the NOR logic gate arrangement. In that circumstance, the drain of transistor 31 will be connected to positive voltage terminal 10 for half a clock cycle, and will be electrically isolated for the other half clock cycle with drains of all of the transistors mentioned so far connected thereto being in the "off" condition.

FIG. 1B shows that there are, however, two additional connections made to the drain of p-channel transistor 31. The first of these is the input of a further CMOS inverter, 32, having its output connected to a shift complete confirmation signal terminal, 33. As a result, terminal 33 will alternate between high and low voltage level logic values when the drain of transistor 31 is alternating between such logic values, as described above, although the logic signal at terminal 33 will be the complement of that occurring at the drain of transistor 31 in this condition.

A further enhancement mode, p-channel field-effect transistor, 34, has its gate connected to terminal 33 and its drain connected to the drain of transistor 31. The source of transistor 34 is connected to positive voltage terminal 10. In this arrangement, a low voltage level logic value occurring at the drain of transistor 31 results in a high voltage level logic value at the output of inverter 32 on terminal 33 so that transistor 34 is in the "off" condition. Alternatively, a high voltage level logic value occurring at the drain of p-channel transistor 31 leads to a low voltage level logic value at the output of inverter 32 on terminal 33 so that transistor 34 goes into the "on" condition. Such an arrangement has no effect on the signal appearing at terminal 33 when the drain of p-channel transistor 31 is oscillating between high and low voltage level logic values, which will occur if a "0" bit is stored in one of the storage registers preceding final storage register 25, other than to provide the complement at terminal 33 of that logic signal.

In the other condition occurring at the drain of p-channel transistor 31, which will occur if the unique state of all "1" bits being stored in the storage register preceding final storage register 25, coupled with a "0" bit being stored in that final storage register, p-channel transistor 31 switches into the "on" condition for half of a cycle in the clock signal present on clock interconnection 22 but switches into the "off" condition for the other half clock cycle. Since all of sensing or logic gate input transistors 29' and 29'' through 29''' are also in the "off" condition, the drain of transistor 31 would be electrically isolated and could drift to a different and unwanted voltage level during such a clock half cycle. However, with transistor 34 in the "on" condition because of transistor 31 having been in the "on" condition for a preceding half cycle, and so having forced inverter 32 to have a low voltage level logic value at its output, the drain of transistor 31 will be kept near the voltage on terminal 10 by transistor 34 being "on" during that second half clock cycle. Hence, terminal 33 will have oscillating voltage states occurring thereat when any "0" bits are stored in any of the storage registers preceding final storage register 25, but will be in the high voltage level logic state for an entire clock cycle upon the shifting into final storage register 25 of the "0" bit introduced in initial storage register 12 by transistor 21 having been completed. This change at terminal 33 then confirms that the shifts of the parallel set of logic values or data bits stored in the shift register arrangement of FIG. 1 after being introduced from terminals 26 have been completely shifted through this shift register arrangement such that each has been sequentially presented at shift register output 28.

Although the present invention has been described with reference to preferred embodiments, workers skilled in the art will recognize that changes may be made in form and detail without departing from the spirit and scope of the invention.

What is claimed is:

1. A shift count confirmation shift register means capable of storing concurrently a selected set of logic values from a plurality of sets of logic values if that said set is provided by a corresponding set of logic signals each provided at a corresponding one of a set of data inputs thereof with each said set having a selected number of logic values therein, said shift count confirmation shift register means being further capable of providing representations of each of a said set of logic values in a sequence at a data output thereof and, thereafter, of providing a shift complete signal at a confirmation signal output thereof, said shift count confirmation shift register means comprising:

a plurality of storage register means of a number exceeding said selected number by at least one with each having a serial input and a shift input, and with each further having a parallel input at each of which logic states can be provided for storage therein, and each having a serial output and a detection output at each of which a representation of a logic state previously stored therein can be provided, said plurality of storage register means providing a shift register by each having its serial input electrically connected to a serial output of another, except for an initial serial input in an initial one of said storage register means and a final serial output in a final one of said storage register means serving as said data output, such that shift signals at said shift inputs can direct stored representations of logic values to propagate along said shift register from said initial shift register means to said final shift register means, said parallel input of each of said plurality of storage means serving as one of said data inputs except an initial parallel input in said initial storage register means;

a state insertion means electrically connected to both of said initial storage register means initial serial and initial parallel inputs, said state insertion means being capable of providing a first logic value for storage in said initial storage register means substantially concurrently with storage of a said set of logic values provided on said data inputs, and of providing thereafter a pattern of logic values in sequential order for storage in said initial storage register means with said sequential pattern of logic values having therein at least one logic value therein opposite in value to said first logic value and with each succeeding one thereof being stored in said initial storage register means in correspondence with each succeeding one of said sequence of representations being provided at said data output; and a state pattern detection means having an output serving as said confirmation signal output and a plurality of inputs each of which is electrically connected to a corresponding one of said state register means at a selected one of its detection and serial outputs, said state pattern detection means being capable of providing an indication at said output thereof as said shift complete signal if said first logic value is stored in said final storage register means concurrently with said sequential pattern of logic values being stored in those of said plurality of storage register means remaining.

2. The apparatus of claim 1 wherein said state insertion means provides said first logic value for storage in said initial storage register means at said parallel input thereof.

3. The apparatus of claim 1 wherein said state insertion means is capable of providing each of said sequential pattern of logic values in succession at said initial storage register means serial input.

4. The apparatus of claim 1 wherein said sequential pattern of logic values is formed by each of said logic values therein all being a said second logic value.

5. The apparatus of claim 1 wherein said state pattern detection means is electrically connected to each of said detection outputs of each of said storage register means except for said final storage register means where said state pattern detection means is electrically connected to said serial output thereof.

6. The apparatus of claim 1 wherein each of said plurality of storage register means is formed of a master flip-flop and a slave flip-flop with said slave flip-flop having an input thereof electrically connected to an output of said master flip-flop, said master flip-flop of each said storage register means having an input serving as said storage register means serial input thereof and said slave flip-flop of each said storage register means having an output serving as said storage register means serial output thereof.

7. The apparatus of claim 2 wherein said state insertion means is capable of providing each of said sequential pattern of logic values in succession at said initial storage register means serial input.

8. The apparatus of claim 3 wherein said sequential pattern of logic values is formed by each of said logic values therein all being a said second logic value.

9. The apparatus of claim 5 wherein said state pattern detection means is capable of performing a NOR logic function on those logic states provided thereto at said storage register means detection and serial outputs to which it is connected as a basis for providing said indication.

10. The apparatus of claim 6 wherein said master flip-flop of each of said storage register means has a further input serving as said storage register means parallel input thereof, and said slave flip-flop of each of said storage register means has a further output serving as said storage register means detection output thereof.

11. The apparatus of claim 7 wherein said sequential pattern of logic values is formed by each of said logic values therein all being a said second logic value.

12. A method for confirming that a series of shifts, needed for representations of a set of acquired and stored logic values to have been sequentially provided at a data output, have been completed in a shift register means, said method comprising:

providing sequentially sets of a selected number logic values from a corresponding set of logic signals to a corresponding one of a set of data inputs of said shift register means for storage therein, said shift register means comprising a plurality of storage register means exceeding said selected number by at least one and together capable of receiving and storing concurrently a said set of logic values, and of providing a sequence of representations of each of a stored said set of logic values at said data output thereof;

providing a first logic value to an input of an initial one of said storage register means for storage therein substantially concurrently with each said provision of a said set of logic values to said data inputs;

providing a representation of each of a said set of logic values stored in said shaft register means at said data output thereof after said storage thereof through shifting among said storage register means those logic values stored therein;

providing sequentially a pattern of logic values at an input of said initial storage register means for storage therein at least one of which is opposite in value to said first value, there being one of said sequential pattern of logic values provided to said initial storage register means for each one of said sequence of representations provided at said data output; and detecting said first logic value stored in a final one of said storage register means and said sequential pattern of logic values stored in those of said plurality of storage registers means remaining as a basis for confirming said shifts have been completed.

* * * * *